US008890157B2

(12) United States Patent
Liu et al.

(10) Patent No.: US 8,890,157 B2
(45) Date of Patent: Nov. 18, 2014

(54) PIXEL STRUCTURE HAVING PATTERNED TRANSPARENT CONDUCTIVE LAYER

(71) Applicant: HannStar Display Corp., New Taipei (TW)

(72) Inventors: Hsuan-Chen Liu, Kaohsiung (TW); Hsien-Cheng Chang, Changhua County (TW); Da-Ching Tang, Tainan (TW); Chien-Hao Wu, Tainan (TW); Ching-Chao Wang, Nantou County (TW); Jung-Chen Lin, Tainan (TW)

(73) Assignee: HannStar Display Corp., Wugu Dist., New Taipei (TW)

( * ) Notice: Subject to any disclaimer, the term of this patent is extended or adjusted under 35 U.S.C. 154(b) by 0 days.

(21) Appl. No.: 13/831,992

(22) Filed: Mar. 15, 2013

(65) Prior Publication Data

US 2014/0197413 A1    Jul. 17, 2014

(30) Foreign Application Priority Data

Jan. 14, 2013   (CN) .......................... 2013 1 0012752

(51) Int. Cl.
| | | |
|---|---|---|
| *H01L 29/04* | (2006.01) | |
| *H01L 29/10* | (2006.01) | |
| *H01L 31/036* | (2006.01) | |
| *H01L 31/0376* | (2006.01) | |
| *H01L 31/20* | (2006.01) | |
| *H01L 29/15* | (2006.01) | |
| *H01L 29/786* | (2006.01) | |
| *H01L 27/12* | (2006.01) | |

(52) U.S. Cl.
CPC ........ *H01L 29/78678* (2013.01); *H01L 27/124* (2013.01)
USPC   257/59; 257/72; 257/E29.117; 257/E29.151; 257/E29.202; 257/E29.273

(58) Field of Classification Search
CPC .............. H01L 27/326; H01L 27/3248; H01L 27/3262; H01L 27/3272; H01L 29/786; H01L 29/4908; H01L 29/42384; H01L 29/78669; H01L 29/78678
USPC ...................... 257/59, 72, E29.117, E29.151, 257/E29.202, E29.273
See application file for complete search history.

(56) References Cited

U.S. PATENT DOCUMENTS

| | | | |
|---|---|---|---|
| 6,030,715 A | 2/2000 | Thompson | |
| 6,303,238 B1 | 10/2001 | Thompson | |
| 6,396,470 B1 | 5/2002 | Zhang | |
| 6,420,031 B1 | 7/2002 | Parthasarathy | |
| 6,469,437 B1 | 10/2002 | Parthasarathy | |
| 7,022,556 B1 * | 4/2006 | Adachi | ......................... 438/149 |

(Continued)

*Primary Examiner* — Ida M Soward
(74) *Attorney, Agent, or Firm* — Winston Hsu; Scott Margo

(57) ABSTRACT

The present invention provides a pixel structure including a substrate, a thin-film transistor disposed on the substrate, a first insulating layer covering the thin-film transistor and the substrate, a common electrode, a connecting electrode, a second insulating layer, and a pixel electrode. The thin-film transistor includes a drain electrode. The first insulating layer has a first opening exposing the drain electrode. The common electrode and the connecting electrode are disposed on the first insulating layer. The connecting electrode extends into the first opening to be electrically connected to the drain electrode. The connecting electrode is electrically insulated from the common electrode. The second insulating layer covers the first insulating layer, the common electrode, the connecting electrode, and has a second opening exposing the connecting electrode. The pixel electrode is disposed on the second insulating layer and electrically connected to the connecting electrode through the second opening.

18 Claims, 7 Drawing Sheets

(56) References Cited

U.S. PATENT DOCUMENTS

| | | | |
|---|---|---|---|
| 7,224,032 B2 * | 5/2007 | Shiraki et al. | 257/347 |
| 7,242,440 B2 * | 7/2007 | Kurashina et al. | 349/44 |
| 7,335,912 B2 * | 2/2008 | Park et al. | 257/59 |
| 7,439,543 B2 * | 10/2008 | Yamazaki | 257/66 |
| 7,449,408 B2 * | 11/2008 | Muranaka et al. | 438/623 |
| 7,548,019 B2 | 6/2009 | Omura | |
| 7,812,352 B2 | 10/2010 | Chien | |
| 7,910,930 B2 * | 3/2011 | Rho | 257/72 |
| 8,130,354 B2 * | 3/2012 | Kimura | 349/141 |
| 8,193,531 B2 * | 6/2012 | Ishikawa et al. | 257/59 |
| 8,445,962 B2 * | 5/2013 | Murakami et al. | 257/347 |
| 8,546,825 B2 * | 10/2013 | Yamazaki et al. | 257/89 |
| 2006/0262254 A1 * | 11/2006 | Inoue et al. | 349/113 |
| 2008/0164474 A1 * | 7/2008 | Yamazaki et al. | 257/59 |
| 2009/0051285 A1 * | 2/2009 | Kajiyama et al. | 313/506 |
| 2010/0025664 A1 * | 2/2010 | Park | 257/40 |
| 2010/0296042 A1 * | 11/2010 | Yonemura | 349/143 |
| 2011/0024758 A1 * | 2/2011 | Kimura | 257/59 |
| 2011/0108842 A1 * | 5/2011 | Yamazaki et al. | 257/59 |
| 2012/0313098 A1 * | 12/2012 | Kim et al. | 257/59 |
| 2013/0256678 A1 * | 10/2013 | Nishikawa | 257/72 |
| 2014/0054592 A1 * | 2/2014 | Gu et al. | 257/71 |

* cited by examiner

PIXEL STRUCTURE HAVING PATTERNED TRANSPARENT CONDUCTIVE LAYER

BACKGROUND OF THE INVENTION

1. Field of the Invention

The present invention relates to a pixel structure and a pixel array substrate, and more particularly, to a pixel structure and a pixel array substrate increasing aperture ratio, which is a technology of HannStar Ultra-high Aperture (HUA).

2. Description of the Prior Art

Liquid crystal display panels have been applied to portable products, such as notebook, PDA, etc. because of having the advantages of light weight, thin thickness, low power consumption and no radiation pollution, and thus, the liquid crystal display panels have been gradually replaced the cathode ray tube (CRT) screen of the laptop computer.

Conventional liquid crystal display panel is formed with the color filter substrate, the pixel array substrate and the liquid crystal layer, in which the liquid crystal layer is disposed between the color filter substrate and the pixel array substrate, and directions of the liquid crystal molecules in the liquid crystal layer can be rotated to control the pixel to display brightness or darkness. Please refer to FIG. 1, which is a schematic diagram illustrating a pixel structure of a pixel array substrate according to the prior art. As shown in FIG. 1, the pixel structure 10 includes a substrate 12, a thin-film transistor 14, a common line 16, a protection layer 18, a planarization layer 20, and a pixel electrode 22. The thin-film transistor 14 is disposed on the substrate 12, and includes a gate electrode 14a, a source electrode 14b, a drain electrode 14c, and a channel layer 14d. The common line 16 is disposed on the substrate 12. The protection layer 18 covers the thin-film transistor 14 and the substrate 12, and has a first opening 18a exposing the drain electrode 14c. The planarization layer 20 covers the protection layer 18, and has a second opening 20a corresponding to the first opening 18a and exposing the drain electrode 14c. The pixel electrode 22 is disposed on the planarization layer 20 and electrically connected to the drain electrode 14c through the first opening 18a and second opening 20a. Furthermore, the common line 16 overlaps the pixel electrode 22, so that the common line 16, the pixel electrode 22, the protection layer 18, and the planarization layer 20 form a storage capacitor.

However, when the first opening 18a is aligned to the drain electrode 14c of the thin-film transistor 14, there is an alignment deviation between them. Also, when the second opening 20a is aligned to the first opening 18a, there is another alignment deviation between them. Furthermore, when the pixel electrode 22 is formed to cover the second opening 20a, there also is another alignment deviation between them. Since the alignment deviations among the first opening 18a, the second opening 20a and the pixel electrode 22 affect one another, a size of the connecting structure for electrically connecting the pixel electrode 22 and the drain electrode 14c of the thin-film transistor 14 is affected by the alignment deviations. Thus, in order to make the pixel electrode 22 be in contact with the drain electrode 14c through the first opening 18a and second opening 20a, a second feature length L2 of the connecting structure should be designed to be larger than a first feature length L1 of the first opening 18a and the same as 4 to 8 times of the first feature length L1 of the first opening 18a, for example, 20 microns to 28 microns. The size of the connecting structure 24 for connecting the pixel electrode 22 and the drain electrode 14c will affect the area of the pixel electrode 22 for displaying, and the aperture ratio of the pixel structure 10 is accordingly limited.

Therefore, with the increase of the image resolution of the pixel array substrate, to raise the aperture ration of the pixel structure is an objective in this field.

SUMMARY OF THE INVENTION

It is therefore an objective of the present invention to provide a pixel structure and a pixel array substrate to increase an aperture ratio of the pixel structure and an aperture ratio of the pixel array substrate.

According to an embodiment, the present invention provides a pixel structure including a substrate, a thin-film transistor, a first insulating layer, a patterned transparent conductive layer, a second insulating layer, and a pixel electrode. The thin-film transistor is disposed on the substrate, and the thin-film transistor includes a gate electrode, a source electrode, and a drain electrode. The first insulating layer covers the thin-film transistor and the substrate, and the insulating layer has a first opening exposing the drain electrode. The patterned transparent conductive layer is disposed on the first insulating layer, and the patterned transparent conductive layer includes a common electrode and a connecting electrode. The connecting electrode extends into the first opening and is electrically connected to the drain electrode. The connecting electrode is electrically insulated from the common electrode. The second insulating layer covers the first insulating layer and the patterned transparent conductive layer, and the second insulating layer has a second opening exposing the connecting electrode. The pixel electrode is disposed on the second insulating layer and electrically connected to the connecting electrode through the second opening. The drain electrode, the first opening, the connecting electrode, the second opening and the pixel electrode form a connecting structure.

According to another embodiment, the present invention provides a pixel array substrate including a plurality of pixel structures arranged in an array formation. The common electrodes of any two of the pixel structures adjacent to each other and in a same row are electrically connected to each other.

The pixel electrode is electrically connected to the drain electrode of the thin-film transistor through the connecting electrode in the pixel structure of the present invention, so that the first opening is not limited to overlap or not overlap the second opening. Accordingly, the third feature length of the connecting electrode for electrically connecting the pixel electrode to the drain electrode of the thin-film transistor can be substantially 1 time to 2.5 times of the first feature length of the first opening or the second feature length of the second opening. Thus, the size of the connecting structure can be effectively decreased, and the aperture ratio of the pixel structure can be effectively raised.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
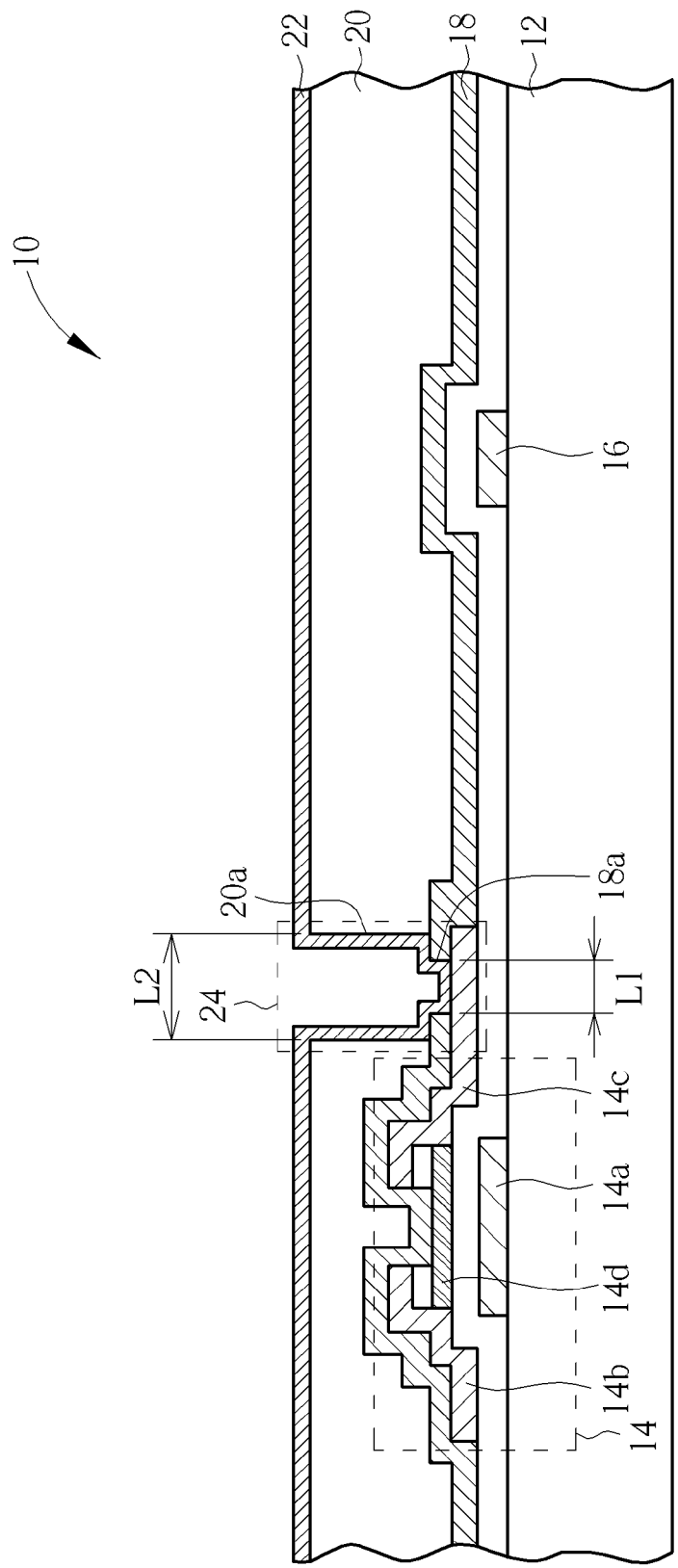
FIG. 1 is a schematic diagram illustrating a pixel structure of a pixel array substrate according to the prior art.
Figure 2:
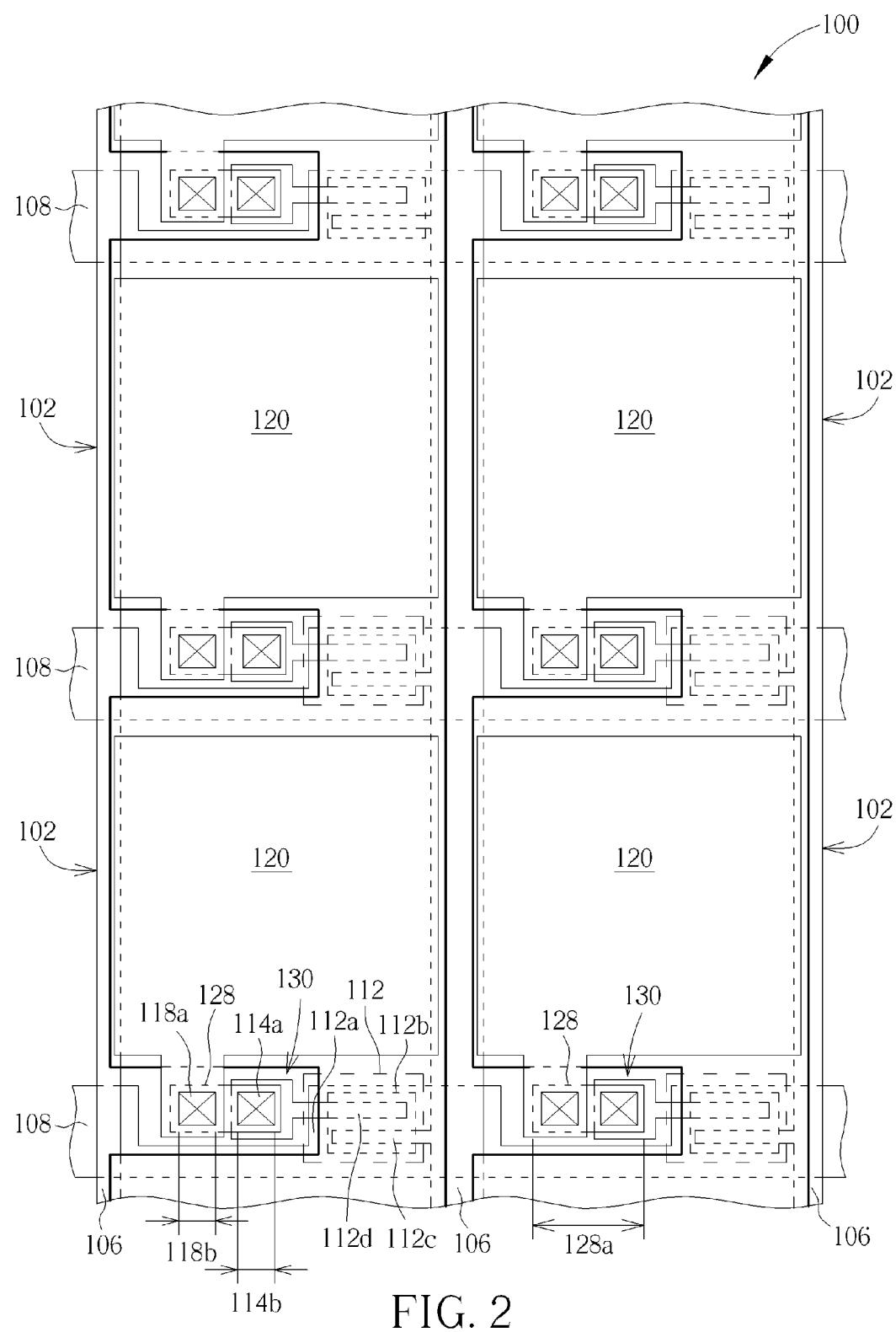
FIG. 2 is a schematic diagram illustrating a top view of a pixel array substrate according to a first embodiment of the present invention.
Figure 3:
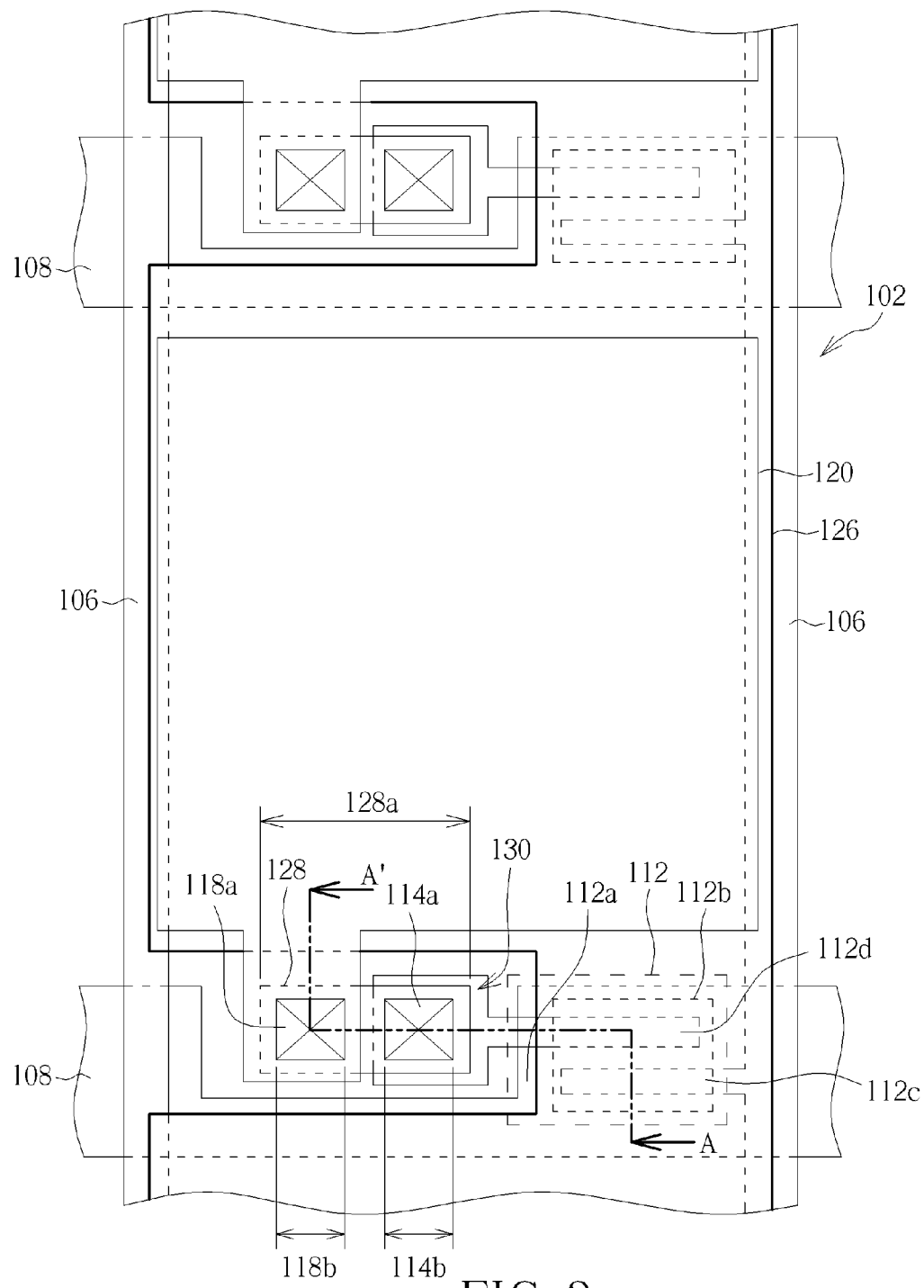
FIG. 3 is a schematic diagram illustrating an enlarged view of a single pixel structure as shown in FIG. 2.
Figure 4:
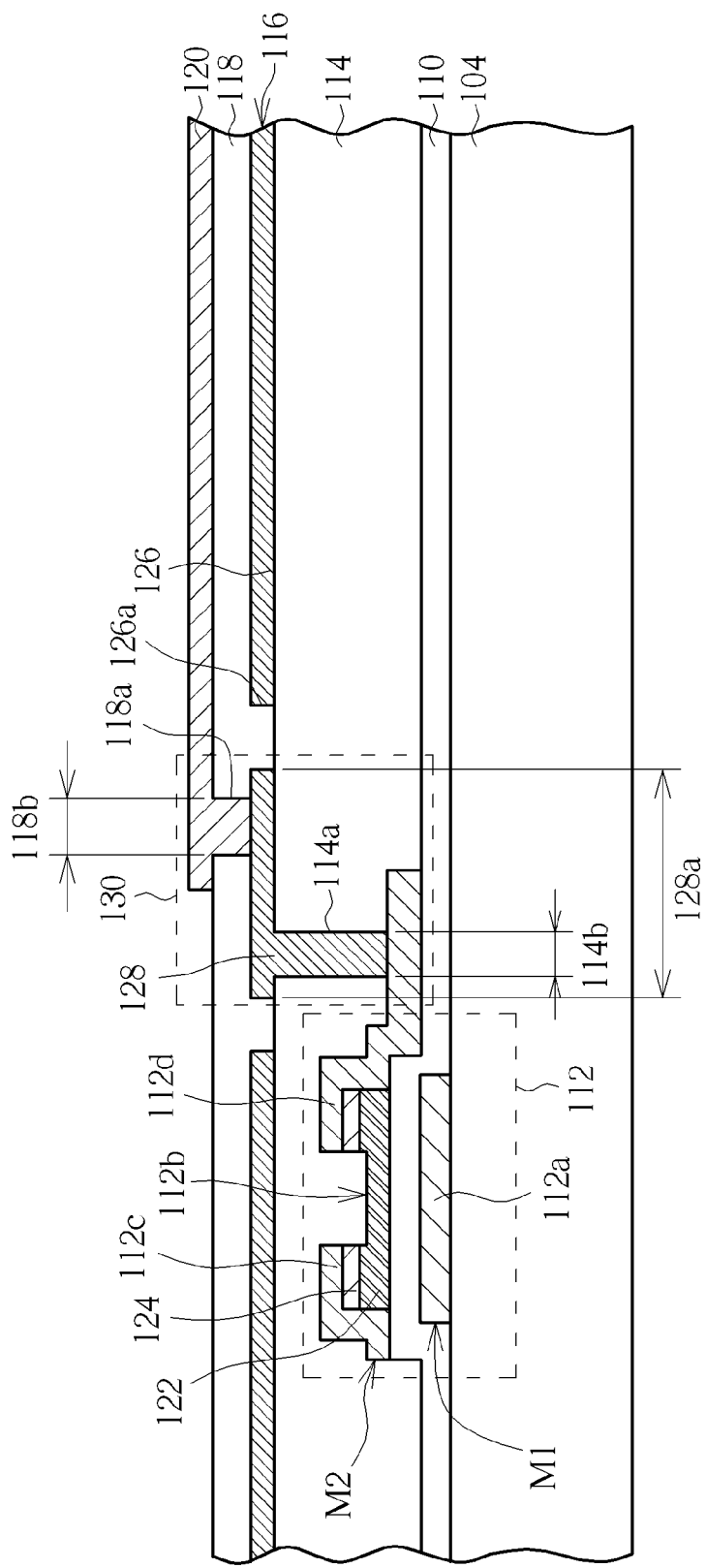
FIG. 4 is a schematic diagram illustrating a cross-sectional view of FIG. 3 taken along a cross-sectional line A-A'

Please refer to FIG. 2 through FIG. 4. FIG. 2 is a schematic diagram illustrating a top view of a pixel array substrate according to a first embodiment of the present invention. FIG. 3 is a schematic diagram illustrating an enlarged view of a single pixel structure as shown in FIG. 2. FIG. 4 is a schematic diagram illustrating a cross-sectional view of FIG. 3 taken along a cross-sectional line A-A'.

As shown in FIG. 2 through FIG. 4, the pixel array substrate 100 of this embodiment includes a plurality of pixel structures 102 arranged in an array formation, in which the pixel structure 102 includes a substrate 104, a data line 106, a scan line 108, a gate insulating layer 110, a thin-film transistor 112, a first insulating layer 114, a patterned transparent conductive layer 116, a second insulating layer 118, and a pixel electrode 120.

In the pixel structure 102 of this embodiment, the data line 106 and the scan line 108 are disposed on the substrate 104, and cross each other. The thin-film transistor 112 is disposed on the substrate 104 and disposed adjacent to a region of the data line 106 crossing the scan line 108. Furthermore, the thin-film transistor 112 includes a gate electrode 112a, a semiconductor layer 112b, a source electrode 112c, and a drain electrode 112d, in which the gate electrode 112a is electrically connected to the scan line 108, and the source electrode 112c is electrically connected to the data line 106.

In this embodiment, the gate electrode 112a of the thin-film transistor 112 is an extending part of the scan line 108. Accordingly, the scan line 108 can be electrically connected to the gate electrode 112a, and the scan line 108 and the gate electrode 112a are formed with a first metal layer M1. The gate insulating layer 110 covers the gate electrode 112a and the scan line 108 formed with the first metal layer M1 and the substrate 104. The semiconductor layer 112b is disposed on the gate insulating layer 110 and right above the gate electrode 112a.

The source electrode 112c of the thin-film transistor 112 is an extending part of the data line 106. Accordingly, the data line 106 can be electrically connected to the source electrode 112c, and the data line 106, the source electrode 112c and the drain electrode 112d are formed with a second metal layer M2. The second metal layer M2 is disposed on the gate insulating layer 110 and the semiconductor layer 112b, so that the gate insulating layer 110 can electrically insulate the first metal layer M1 from the second metal layer M2. Moreover, the source electrode 112c and the drain electrode 112d are not in contact with each other, and are disposed corresponding to two sides of the gate electrode 112a respectively. Also, the source electrode 112c and the drain electrode 112d partially overlap the gate electrode 112a respectively.

In addition, the semiconductor layer 112b may include a channel layer 122 and an ohmic contact layer 124. The channel layer 122 is disposed on the gate insulating layer 110, and may include for example amorphous silicon, polysilicon, metal oxide semiconductor material or other semiconductor material, but the present invention is not limited thereto. The ohmic contact layer 124 is disposed between the channel layer 122 and the source electrode 112c and between the channel layer 122 and the drain electrode 112d, and the ohmic contact layer 124 may be used to reduce the contact resistance between the silicon and the metal material. For example, the ohmic contact layer may include amorphous silicon doped with ions, polysilicon, metal oxide semiconductor material or other semiconductor material, but the present invention is not limited thereto.

The structures of the thin-film transistor, the scan line and the data line are not limited to the above-mentioned structure, and may be other modified structures. For example, the thin-film transistor may be other kinds of transistors. Or, the scan line and the gate electrode are not formed with the same metal layer. Or, the data line, the source electrode, and the drain electrode are not formed with the same metal layer.

Furthermore, in the technology of HUA of the present invention, the first insulating layer 114 covers the thin-film transistor 112, the data line 106 and the gate insulating layer 110, and the first insulating layer 114 has a first opening 114a exposing the drain electrode 112d. For example, the first opening 114a may be a rectangular opening, and a first feature length 114b of the first opening 114a, such as a length of a side of the first opening 114a, may be substantially less than 4 microns. The present invention is not limited thereto. The first opening also may be other shapes. For example, the first opening is circular shape, and the first feature length of the first opening in this case is diameter.

In this embodiment, the first insulating layer 114 may include photoresist material, but the present invention is not limited thereto. The first insulating layer 114 may include organic material or inorganic material. The patterned transparent conductive layer 116 is disposed on the first insulating layer 114, and the patterned transparent conductive layer 116 may be formed with transparent conductive materials, such as indium tin oxide, indium zinc oxide, aluminum tin oxide or aluminum zinc oxide, but the present invention is not limited herein.

In the technology of HUA of the present invention, the patterned transparent conductive layer 116 includes a common electrode 126 and a connecting electrode 128. The common electrode 126 is configured to transmit a common signal. The connecting electrode 128 extends into the first opening 114a to be in contact with the drain electrode 112d, so that the connecting electrode 128 is electrically connected to the drain electrode 112d. Furthermore, the connecting electrode 128 is not in contact with the common electrode 126, so that the connecting electrode 128 is electrically insulated from the common electrode 126.

In the pixel array substrate 100 of this embodiment, the common electrodes 126 of any two of the pixel structures 102 adjacent to each other and disposed in a same row are electrically connected to each other, so that the common electrodes 126 of the pixel structures in the same row can be connected to each other to form a common line. Additionally, in one of the pixel structures 102, the common electrode 126 may extend to overlap the thin-film transistor 112, the data line 106, and the scan line 108, so that the common electrode 126 may be configured to shield and insulate the coupling effect generated by an electrode disposed above the common electrode 126 coupled with the thin-film transistor 112, the data line 106 and each scan line 108 disposed under the common electrode 126. Accordingly, the electrical potential change in the electrode disposed above the common electrode 126 affected by the thin-film transistor 112, the data line 106 and the scan line 108 disposed under the common electrode 126 can be reduced.

In other embodiment of the present invention, the common electrodes of any two of the pixel structures adjacent to each other and disposed in a same column may be electrically connected to each other. Or, each common electrode may only overlap each data line. Or, each common electrode may only overlap each scan line or each thin-film transistor.

Additionally, the second insulating layer 118 covers the patterned transparent conductive layer 116 and the first insulating layer 114, and the second insulating layer 118 has the second opening 118a exposing the connecting electrode 128. For example, the second opening 118a may be a rectangular opening, and a second feature length 118b of the second opening 118a may be substantially less than 4 microns, but the present invention is not limited thereto. The second opening 114a may be other shapes, such as circular shape, and the second feature length of the second opening in this case is diameter. Furthermore, in order to avoid the common electrode 126 electrically connecting the drain electrode 112d and the connecting electrode 128, the common electrode 126 has an opening 126a corresponding to first opening 114a and the second opening 118a, so that the common electrode 126 does not overlap the first opening 114a and the second opening 118a.

In this embodiment, a size of the second opening 118a is the same as a size of the first opening 114a, but the present invention is not limited herein. In other embodiment of the present invention, the size of the first opening may be different from the size of the second opening.

The pixel electrode 120 is disposed on the second insulating layer 118, and is in contact with the connecting electrode 128 through the second opening 118a, so that the pixel electrode 120 is electrically connected to the connecting electrode 128. Accordingly, the pixel electrode 120 may be electrically connected to the drain electrode 112d through the connecting electrode 128. When the pixel array substrate 100, the color filter substrate and the liquid crystal layer form the liquid crystal display panel, the voltage in the pixel electrode 120 can be used to control the arranged direction of the liquid crystal molecules in the liquid crystal layer. Furthermore, the pixel electrode 120, the second insulating layer 118 and the common electrode 126 may form a storage capacitor configured to store a voltage signal transmitted to the pixel electrode.

It should be noted that the common electrode 126 in this embodiment extends to overlap the thin-film transistor 112, the data line 106 and the scan line 108, so that the common electrode 126 can shield the pixel electrode 120 from being affected by the electric charges in the thin-film transistor 112, the data line 106 and the scan line 108. Accordingly, the coupling effect between the pixel electrode 120 and the thin-film transistor 112, the coupling effect between the pixel electrode 120 and the data line 106 and the coupling effect between the pixel electrode 120 and the scan line 108 can be reduced.

According to the above-mentioned description, the pixel electrode 120 can be disposed closer to the thin-film transistor 112, the data line 106 and the scan line 106 through the above-mentioned HUA technology. For example, the pixel electrode 120 may overlap the data line 106, so that the region between the pixel electrode and the data line in the prior art can be effectively used to display image. Accordingly, the aperture ratio in this embodiment can be raised. In other embodiment of the present invention, the pixel electrode also may over lap the scan line, but the present invention is not limited herein.

Furthermore, the drain electrode 112d, the first opening 114a, the connecting electrode 128, the second opening 118a and the pixel electrode 120 form a connecting structure 130 in this embodiment. It should be noted that the connecting electrode 128 is electrically connected to the drain electrode 112d of the thin-film transistor 112 through the first opening 114a, and the pixel electrode 120 is electrically connected to the connecting electrode 128 through the second opening 114b. Thus, when the connecting electrode 128 overlap the first opening 114a and the second opening 118a simultaneously, the pixel electrode 120 may be electrically connected to the drain electrode 112d of the thin-film transistor 112 through the connecting electrode 128.

According to the above-mentioned description, the first opening 114a is not limited to overlap or not overlap the second opening 118a. Accordingly, in designing the size of the first opening 114a and the second opening 114b, the alignment deviation between the first opening 114a and the drain electrode 112d of the thin-film transistor 112 does not affect the alignment deviation between the second opening 118a and the connecting electrode 128. Thus, the third feature length 128a of the connecting electrode 128 used to electrically connect the pixel electrode 120 to the drain electrode 112d of the thin-film transistor 112 may be 1 time to 2.5 times of the first feature length 114b of the first opening 114a or the second feature length 118b of the second opening 118a, which is about 4 microns to 10 microns and less than conventional 20 microns to 28 microns. For this reason, the size of the connecting structure 130 can be effectively reduced, and the aperture ratio of the pixel structure 102 can be effectively raised.

In this embodiment, the first opening 114a does not overlap the second opening 118a. Accordingly, the third feature length 128a of the connecting electrode 128 may be equal to or larger than a sum of the first feature length 114b of the first opening 114a and the second feature length 118b of the second opening 118a. For example, when the size of the first opening 114a is the same as the size of the second opening 118a, the third feature length 128a of the connecting electrode 128 may be substantially equal to or larger than two times of the first feature length 114b of the first opening 114a, for example, 8 microns. The present invention is not limited herein.

In this embodiment, the third feature length 128a of the connecting electrode 128 is substantially the size of the connecting structure 130. Also, the third feature length 128a of the connecting electrode 128 can be reduced to be 2.5 times of the first feature length 114b of the first opening 114a from 4 times to 8 times of the first feature length of the first opening 114a, so that the area of the transparent pixel electrode 120 can be increased to raise the aperture ratio of the pixel structure 102.

In addition, the connecting electrode 128 and the common electrode 126 are formed with the same patterned transparent conductive layer 116, so that the connecting electrode 128 may be formed when the common electrode 126 is formed. Accordingly, the disposition of the connecting electrode 128 does not increase the manufacturing steps, and the manufacturing cost will not be increased because of the connecting electrode 128.

Furthermore, the second opening 118a in this embodiment corresponds to the connecting electrode 128. Thus, the connecting electrode 128 can be used to protect the first insulating layer 114 from being damaged by the etching solution when the second insulating layer 118 is etched to form the second opening 118a. Accordingly, when the pixel electrode 120 is formed, the common electrode 126 can be avoided being electrically connected to the pixel electrode 120 because the first insulating layer is damaged.

The pixel structure in the present invention is not limited to the above-mentioned embodiment. The following description continues to detail the other embodiments or modifications, and in order to simplify and show the differences between the other embodiments or modifications and the above-mentioned embodiment, the same numerals denote the same components in the following description, and the same parts are not detailed redundantly.

Figure 5:
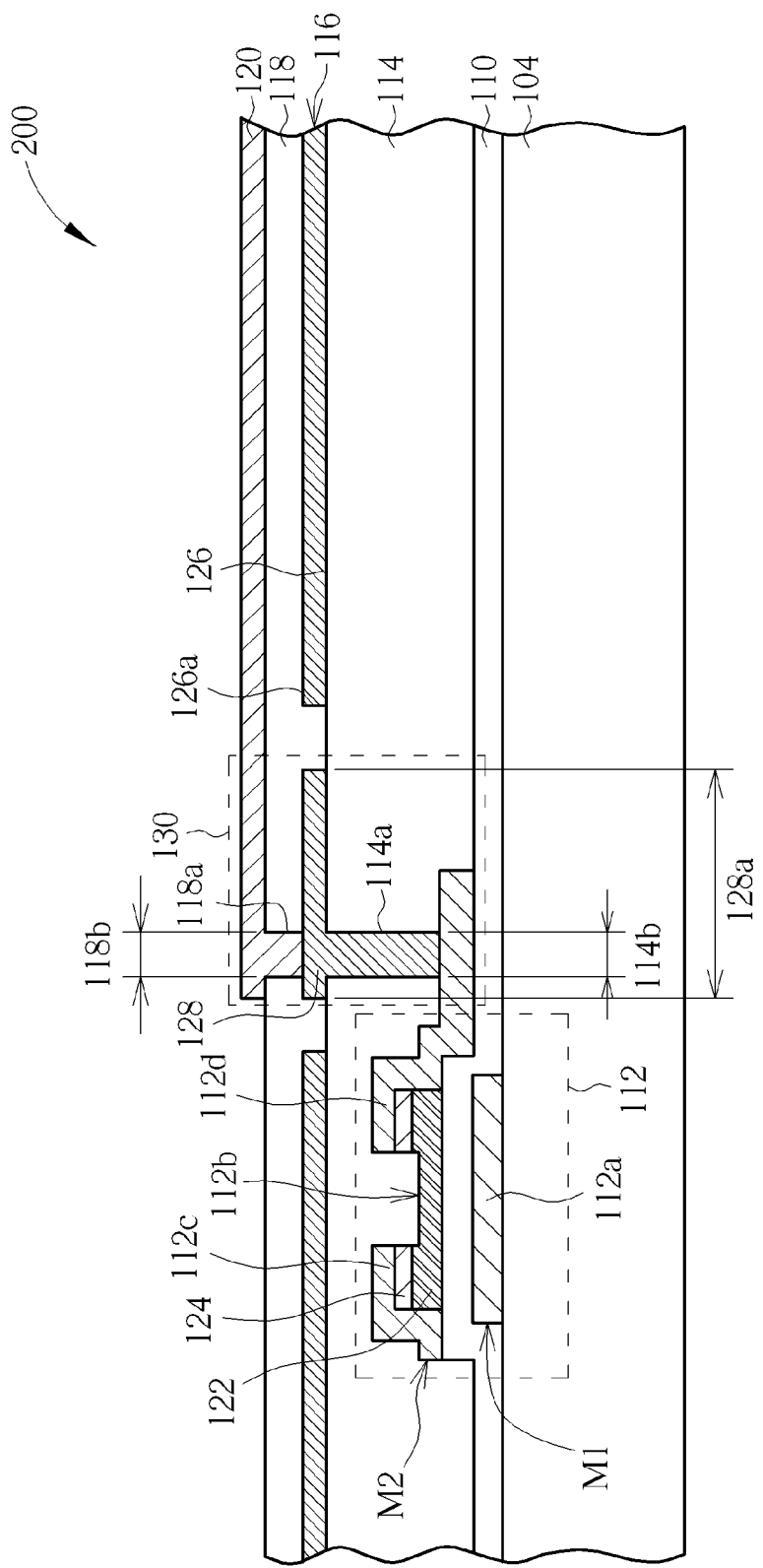
FIG. 5 is a schematic diagram illustrating a pixel structure according to a second embodiment of the present invention.

Please refer to FIG. 5, which is a schematic diagram illustrating a pixel structure according to a second embodiment of the present invention. As shown in FIG. 5, as compared with the first embodiment, the second opening 118a and the first opening 114a of the pixel structure 200 overlap each other in this embodiment, so that the third feature length 128a of the connecting electrode can be reduced to be substantially the same as the first feature length 114b of the first opening 114a or the second feature length 118b of the second opening 118a. For example, when the size of the first opening 114a is the same as the size of the second opening 118a, the third feature length 128a of the connecting electrode 128 may be equal to or larger than 1 time of the first feature length 114b of the first opening 114a, for example, 4 microns, which is less than conventional 20 microns to 28 microns. Accordingly, the size of the connecting structure 130 can be further reduced to be substantially the same as the first feature length 114b of the first opening 114a or the second feature length 118b of the second opening 118a, but the present invention is not limited herein.

Therefore, the third feature length 128a of the connecting electrode 128 can be reduced to be one time of the first feature length 114b of the first opening 114a from 4 times to 8 times of the first feature length 114b of the first opening 114a in this embodiment. Accordingly, the area of the transparent pixel electrode 120 can be increased to raise the aperture ratio of the pixel structure 200.

Figure 6:
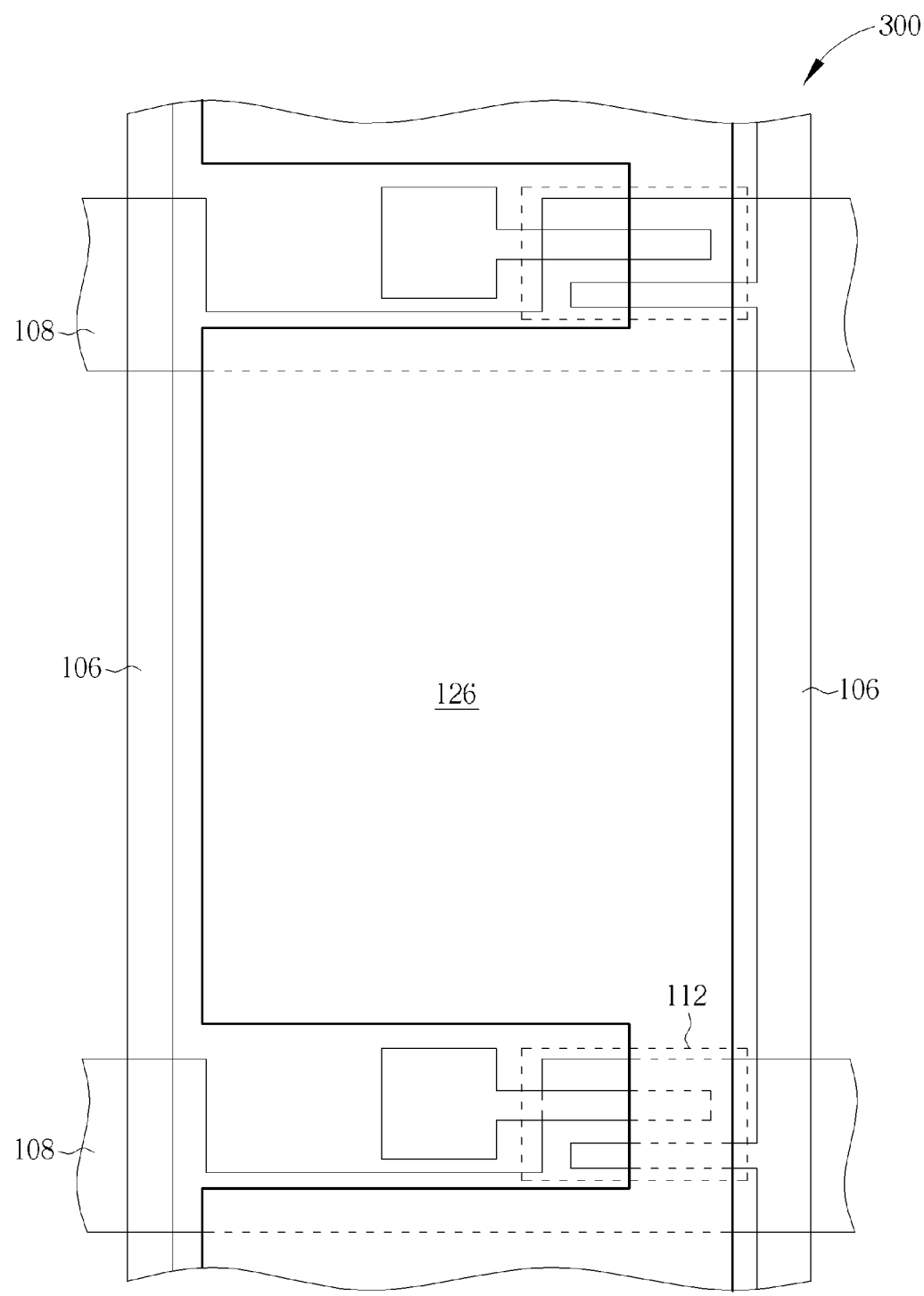
FIG. 6 is a schematic diagram illustrating a pixel structure according to a third embodiment of the present invention.

Please refer to FIG. 6, which is a schematic diagram illustrating a pixel structure according to a third embodiment of the present invention. As shown in FIG. 6, as compared with the first embodiment, the common electrode 126 does not overlap the data line 106, and only overlap the scan line 108 and the thin-film transistor 112 in the pixel structure 300 of this embodiment.

Figure 7:
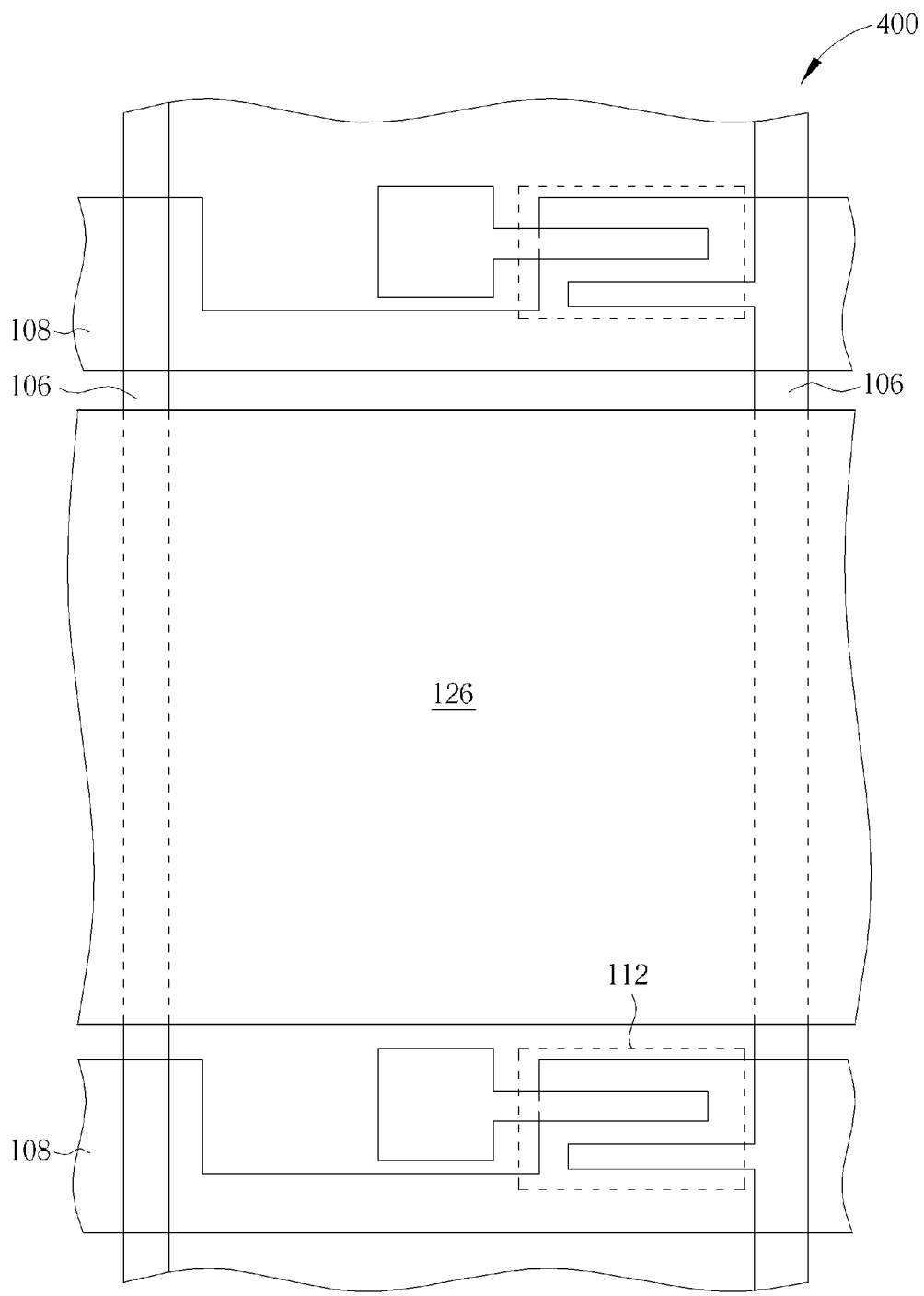
FIG. 7 is a schematic diagram illustrating a pixel structure according to a fourth embodiment of the present invention.

Please refer to FIG. 7, which is a schematic diagram illustrating a pixel structure according to a fourth embodiment of the present invention. As shown in FIG. 7, as compared with the first embodiment, the common electrode 126 does not overlap the scan line 108 and the thin-film transistor 112, and only overlap the data line 106 in the pixel structure 400 of this embodiment.

In summary, the pixel electrode is electrically connected to the drain electrode of the thin-film transistor through the connecting electrode in the pixel structure of the present invention, so that the first opening is not limited to overlap or not overlap the second opening. Accordingly, the third feature length of the connecting electrode for electrically connecting the pixel electrode to the drain electrode of the thin-film transistor can be substantially 1 time to 2.5 times of the first feature length of the first opening or the second feature length of the second opening. Thus, the size of the connecting structure can be effectively decreased, and the aperture ratio of the pixel structure can be effectively raised.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pixel structure, comprising:
   a substrate;
   a thin-film transistor disposed on the substrate, and the thin-film transistor comprising a gate electrode, a source electrode, and a drain electrode;
   a first insulating layer covering the thin-film transistor and the substrate, and the first insulating layer having a first opening exposing the drain electrode;
   a patterned transparent conductive layer disposed on the first insulating layer, and the patterned transparent conductive layer comprising:
      a common electrode; and
      a connecting electrode extending into the first opening to be electrically connected to the drain electrode, and the connecting electrode being electrically insulated from the common electrode, wherein a third feature length of the connecting electrode is substantially 1 to 2.5 times of a first feature length of the first opening or a second feature length of the second opening;
   a second insulating layer covering the first insulating layer and the patterned transparent conductive layer, and the second insulating layer having a second opening exposing the connecting electrode; and
   a pixel electrode disposed on the second insulating layer and electrically connected to the connecting electrode through the second opening;
   wherein the drain electrode, the first opening, the connecting electrode, the second opening and the pixel electrode form a connecting structure.

2. The pixel structure according to claim 1, wherein a third feature length of the connecting electrode is equal to or larger than a sum of a first feature length of the first opening and a second feature length of the second opening.

3. The pixel structure according to claim 1, wherein a size of the first opening is the same as a size of the second opening.

4. The pixel structure according to claim 3, wherein a third feature length of the connecting electrode is equal to or larger than two times of a first feature length of the first opening or a second feature length of the second opening.

5. The pixel structure according to claim 1, wherein the second opening overlaps the first opening.

6. The pixel structure according to claim 5, wherein a third feature length of the connecting electrode is equal to or larger than one time of a first feature length of the first opening or a second feature length of the second opening.

7. The pixel structure according to claim 1, wherein the common electrode overlaps the thin-film transistor.

8. The pixel structure according to claim 1, further comprising:
   a data line disposed on the substrate and electrically connected to the source electrode; and
   a scan line disposed on the substrate and electrically connected to the gate electrode.

9. The pixel structure according to claim 8, wherein the common electrode overlaps the data line or the scan line.

10. The pixel structure according to claim 1, wherein the common electrode does not overlap the first opening and the second opening.

11. A pixel array substrate, comprising:
   a plurality of the pixel structures according to claim 1 arranged in an array formation;

wherein the common electrodes of any two of the pixel structures adjacent to each other and disposed in a same row are electrically connected to each other.

12. The pixel array substrate according to claim 11, wherein a third feature length of the connecting electrode is equal to or larger than a sum of a first feature length of the first opening and a second feature length of the second opening.

13. The pixel array substrate according to claim 11, wherein a size of the first opening is the same as a size of the second opening.

14. The pixel array substrate according to claim 11, wherein the second opening overlaps the first opening.

15. The pixel array substrate according to claim 11, wherein the common electrode overlaps the thin-film transistor.

16. The pixel array substrate according to claim 1, further comprising:
    a data line disposed on the substrate and electrically connected to the source electrode; and
    a scan line disposed on the substrate and electrically connected to the gate electrode.

17. The pixel array substrate according to claim 16, wherein the common electrode overlaps the data line or the scan line.

18. The pixel array substrate according to claim 11, wherein the common electrode does not overlap the first opening and the second opening.

* * * * *